United States Patent [19]

Pool

[11] Patent Number: 4,716,365

[45] Date of Patent: Dec. 29, 1987

[54] CIRCUIT TESTER

[75] Inventor: James L. Pool, Clarinda, Iowa

[73] Assignee: Lisle Corporation, Clarinda, Iowa

[21] Appl. No.: 786,747

[22] Filed: Oct. 11, 1985

[51] Int. Cl.[4] ............................................ G01R 31/02
[52] U.S. Cl. ................................ 324/158 P; 324/72.5; 439/482
[58] Field of Search .......................... 324/72.5, 158 P; 339/108 TP, 113 L

[56] References Cited

U.S. PATENT DOCUMENTS

| 2,639,318 | 5/1953 | Des Roches | 339/108 TP |
| 3,201,746 | 8/1965 | Askew | 324/72.5 |
| 3,363,171 | 1/1968 | Sietmann et al. | 324/72.5 |
| 3,864,629 | 2/1975 | Danna | 324/72.5 |

FOREIGN PATENT DOCUMENTS 617464  4/1961  Canada .

Primary Examiner—Reinhard J. Eisenzopf
Assistant Examiner—Vinh P. Nguyen
Attorney, Agent, or Firm—Allegretti, Newitt, Witcoff & McAndrews, Ltd.

[57] ABSTRACT

A circuit tester is described herein and includes a housing closed by a removable cap member. An electrode, or wire contact, extends through the cap member and electrically interconnects with a bulb, fitted within the housing. The electrode carries a spring-biased catch member which is used to select and capture the wire under investigation.

5 Claims, 3 Drawing Figures

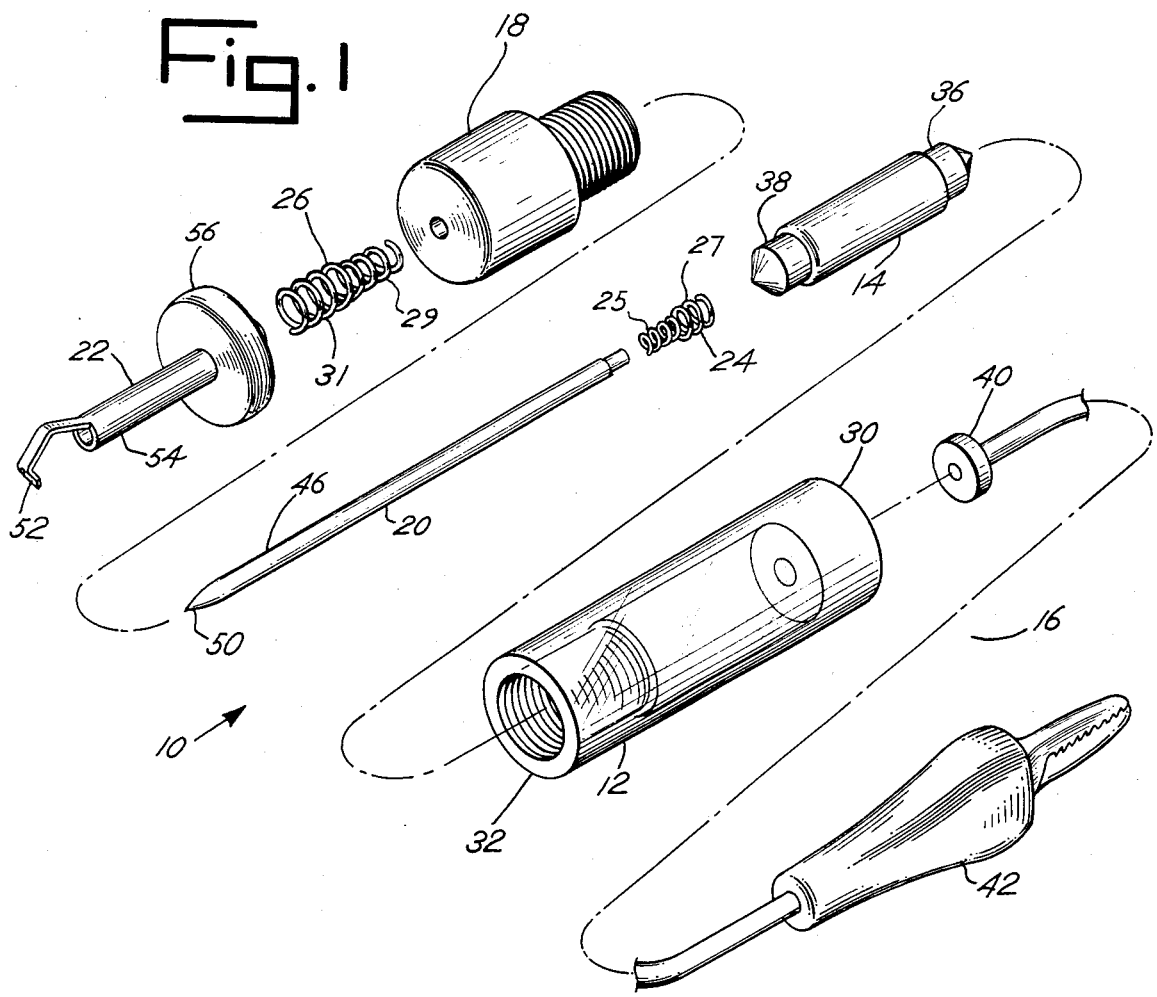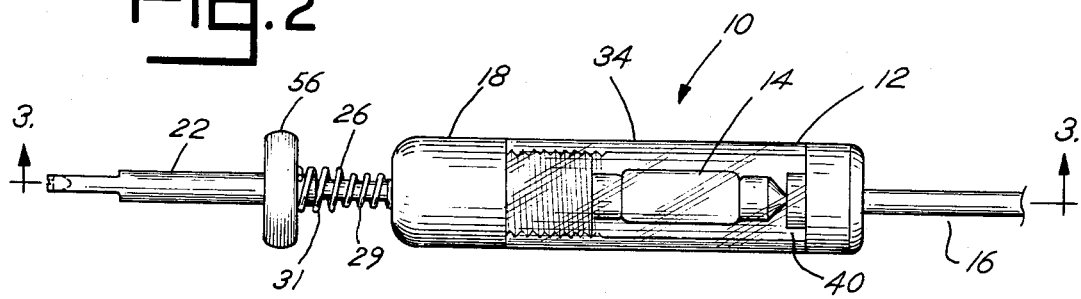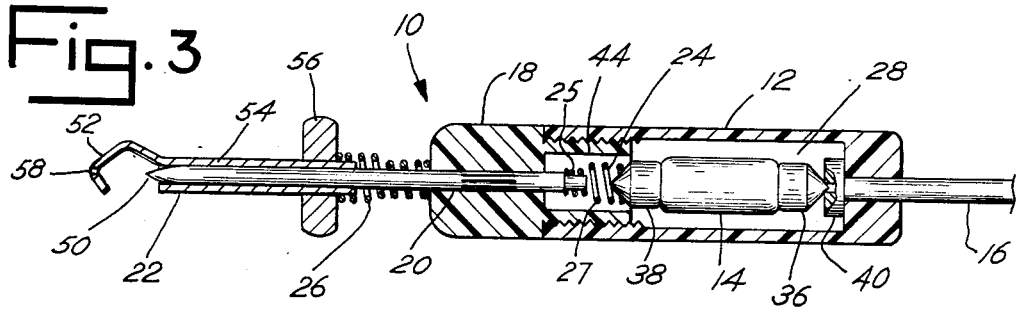

CIRCUIT TESTER

BACKGROUND OF THE INVENTION

The present invention relates to a circuit tester and more particularly to an inexpensive, yet reliable circuit tester.

Circuit testers are utilized to determine whether a particular line or wire carries power. In an automobile, for example, a mechanic may use a circuit tester to test the various wires of an automobile. The testing of the circuits with wires in current day automobiles becomes more complex inasmuch as the many accessories on an automobile are electric powered thus necessitating many additional power and control wires for automobiles. Any fault associated with a particular circuit will necessitate the use of a circuit tester which permits quick and easy interconnection to the wire being investigated with a positive contact therewith. Additionally, such a circuit tester should provide a positive and easily recognized indication that there is power in the wire under investigation.

Heretofore various circuit testers have been proposed and patented for use with electric circuitry involving wires such as electrical circuitry associated with appliances and automobiles. Included among these prior art references are the following patents:

| Pat. No. | Inventor | Title | Issue Date |
| --- | --- | --- | --- |
| 2,639,318 | Des Roches | Circuit Tester | 5/19/53 |
| 3,201,746 | Askew | Test Probe with Grappler | 8/17/65 |
| 3,363,171 | Sietmann, et al | Electrical Circuit Tester with Insulation Piercing Probe Means | 1/9/68 |
| 3,864,629 | Danna | Electrical Circuit Tester | 2/4/75 |

The various patents disclose types of circuit testers which include a gripping mechanism for holding a wire to be tested in position while contact is made by a probe which pierces the coating for the wire to determine whether the wire has power therethrough. While the various patents described depict apparatus which are useful, an improved circuit tester of the general type disclosed having a fewer number of parts, which is easily repairable and which is easy to use has been sought.

SUMMARY OF THE INVENTION

In a principal aspect, the present invention is a simple, readily manufactured and maintained, and easily used circuit tester. The present invention provides quick and secured contact with the wire to be tested, quick and easy release, and a positive visual display.

The present invention includes a housing, having a transparent portion, adapted to receive a bulb. The bulb extends at least into the transparent portion so as to be visual in both the lit and unlit state. A ground lead is connected, through one end of the housing, to one contact of the bulb.

The second end of the housing is closed by a removable cap member. An electrode is secured to this cap member, passing therethrough and terminating in a pointed end. When the cap member is applied to the housing, the electrode interconnects to the second contact of the bulb.

A catch member is slideably mounted on the electrode and maintained thereon by a spring, interposed the cap member and catch member. The spring also biases the catch member towards an at-rest position.

The catch member includes a hook portion, which extends beyond the pointed end of the electrode in the at-rest position, and a grasping portion. The hook portion facilitates isolation, segregation, and capture of the wire under investigation. The grasping portion facilitates retraction of the catch member against the spring, which draws the hook portion and captured wire towards the pointed tip of the electrode.

It is thus an object of the present invention to provide a simple, inexpensive, reliable circuit tester. Another object is a readily maintained, easily operated circuit tester.

These and other features, objects, and advantages of the present invention are set forth or implicit in the following detailed description.

BRIEF DESCRIPTION OF THE DRAWING

A preferred embodiment of the present invention is shown, in detail, on the accompanying drawing wherein:

FIG. 1 is an exploded perspective view of the present invention;

FIG. 2 is a partial side view of the present invention; and

FIG. 3 is a partial cross-sectional view of the preferred embodiment shown in FIG. 2 taken along 3—3.

DETAILED DESCRIPTION OF THE DRAWING

A preferred embodiment of the present invention is shown in FIGS. 1-2 as a circuit tester 10. The tester 10 includes a housing 12, bulb 14, ground connector or wire 16, cap member 18, electrode 20, catch member 22, and springs 24, 26.

The housing 12 is preferably cylindrical, defining a central chamber 28. The housing 12 includes a closed end 30, an open end 32 and at least a transparent portion 34. In this preferred embodiment, the entire housing 12 is transparent. As shown, the open end 32 is internally threaded.

The bulb 14 is adapted to closely fit within the central chamber 28 of the housing 12 so as to be visualized, at least in part, through the transparent portion 34 thereof. That is, the bulb 14 extends into the transparent portion 34. The bulb 14 has two contacts 36, 38 at opposite ends thereof.

The ground wire 16 extends through the closed end 30 of the housing 12. Preferably the housing 12 is injection-molded about and upon the ground wire 16 to provide a strong, secure interconnection. As shown, the ground wire 16 is insulated and includes a plate contact 40 within the housing 12 and an alligator clip 42 at the opposite end thereof for appropriate electrical connection to a ground terminal (not shown). In the assembled state, the contact 36 of the bulb 14 engages the plate contact 40 of the ground wire 16 to define an electrical circuit.

The cap member 18 is externally threaded to mate with and close the housing 12 in the assembled state. The cap member 18 defines an interior chamber or counterbore 44 axially aligned with the electrode 20 which is rigidly positioned in the end of the cap member 18. In this preferred embodiment, the cap member 18 is injection-molded upon the electrode 20 and the surface of the electrode is knurled or shaped to enhance retention by the molded cap member 18.

The electrode 20 is spike-shaped having a projecting needle portion 46 and a contact end 48. The needle portion 46 extends through the cap member 12 and terminates in a pointed end 50. The contact end 48 projects into the interior chamber 44 of the cap member 18.

The spring 24 has a dual diameter. The narrow diameter end 25 of spring 24 fits over the contact end 48 within the chamber 44 and frictionally grips the elctrode 20. The large diameter end 27 of spring 24 receives and electrically contacts the contact 38 of bulb 14. As the cap member 18 is threaded into the open end 32 of the housing 12, the spring 24 electrically interconnects the end 48 of the electrode 20 to the second contact 38 of the bulb 14.

The catch member 22 is adapted to receive and slideably mount upon the electrode 20 or more particularly the needle portion 46 thereof. As shown, the catch member 22 includes a hook portion 52 at one end thereof, a substantially cylindrical body portion 54, and a grasping portion 56, opposite the hook portion 52. The grasping portion 56 is disc shaped and has a diameter substantially enlarged with respect to the electrode 20 and body portion 54 to facilitate manual operation.

The spring 26 fits over and receives the needle portion 46 of the electrode 20 and interposes the cap member 18 and catch member 22. One end of the spring 26 is frictionally secured or affixed to the end of body portion 54 and the opposite or small end of spring 26 is frictionally secured to the electrode 20. The spring 26 retains the catch member 22 on the electrode 20 and biases the catch member 22 towards an atrest position wherein the hook portion 52 of the catch member 22 extends beyond the pointed end 50 of the electrode 20. In the embodiment depicted, spring 26 is identical to spring 24 and includes a small diameter end 29 frictionally secured to the electrode 20 and a large diameter end 31 frictionally engaged over the end of the body portion 54.

In this preferred embodiment, the hook portion 52 of the catch member 22 includes or defines a passage 58, substantially coaxial with the needle portion 46 of the electrode 20. The passage 58 is adapted to receive and protect the pointed end 50 of the electrode 20 during operation.

The circuit tester 10 is simple and easy to use. First, the alligator clip 42 is attached to a suitable ground. The wire to be tested for power is located and captured by means of the book portion 52 of the catch member 22. Retraction of the catch member 22, against the spring 26 and towards the cap member 18, causes engagement between the wire under investigation and the electrode 20. Appropriate force drives the pointed end 50 of the electrode 20 through the insulation, electrically interconnecting the wire through the circuit tester 10 to ground. If power exists in the wire, then the bulb 14 illuminates.

A single preferred embodiment has been described. It is to be understood, however, that certain changes and modifications can be made without departing from the scope and spirit of the present invention. That scope and spirit is defined by the following claims, to be interpreted in view of the foregoing.

What is claimed is:

1. A circuit tester comprising, in combination:
   a housing having a closed end, an open end, and a transparent portion, said housing defining a central chamber;
   a bulb adapted to fit within said central chamber and extending into said transparent portion, said bulb including a first and second contact;
   ground means, extending through said housing, for interconnecting with and grounding said first contact of said bulb;
   a removable cap member adapted to engage and close said open end of said housing in an assembled state;
   an electrode fixedly secured to said removable cap member, said electrode extending through the cap member and including a head portion within said removable cap member and a needle portion defining a pointed end and extending outside the cap member for contacting a wire;
   spring contact means interconnecting said head portion of said electrode and said second contact of said bulb in said assembled state;
   a catch member slidably mounted on said electrode, said catch member including a hook portion and a grasping portion opposite said hook portion; and
   means for simultaneously maintaining said catch member on said electrode and for positionally biasing said catch member towards an at-rest position, said hook portion of said catch member extending beyond said pointed end of said electrode in said at-rest position and translatable against a biasing force to engage a wire against the pointed end, said means for maintaining comprising a single spring member connected at its opposite ends to the cap member and the grasping portion of the catch member.

2. A circuit tester as claimed in claim 1 wherein said grasping portion is substantially annular and substantially enlarged with respect to said electrode.

3. A circuit tester as claimed in claim 1 wherein said hook portion of said catch member defines a passage substantially coaxial with said needle portion of said electrode and adapted to receive and protect said pointed end.

4. A circuit tester as claimed in claim 1 wherein the ground means extend through closed end of said housing for interconnecting with and grounding said first contact of said bulb.

5. A circuit tester as claimed in claim 1 wherein said spring contact means comprise a spring member interposed between the head portion of the electrode and said second contact of said bulb in said assembled state.

* * * * *